(12) United States Patent
Chen et al.

(10) Patent No.: US 11,656,279 B2
(45) Date of Patent: May 23, 2023

(54) METHOD FOR MONITORING CIRCUIT BREAKER AND APPARATUS AND INTERNET OF THINGS USING THE SAME

(71) Applicant: Hitachi Energy Switzerland AG, Baden (CH)

(72) Inventors: Niya Chen, Beijing (CN); Rongrong Yu, Beijing (CN); Jiayang Ruan, Beijing (CN)

(73) Assignee: Hitachi Energy Switzerland AG, Baden (CH)

( * ) Notice: Subject to any disclaimer, the term of this patent is extended or adjusted under 35 U.S.C. 154(b) by 0 days.

(21) Appl. No.: 16/756,487

(22) PCT Filed: Oct. 16, 2017

(86) PCT No.: PCT/CN2017/106364
§ 371 (c)(1),
(2) Date: Apr. 16, 2020

(87) PCT Pub. No.: WO2019/075612
PCT Pub. Date: Apr. 25, 2019

(65) Prior Publication Data
US 2020/0278397 A1 Sep. 3, 2020

(51) Int. Cl.
*G01R 31/327* (2006.01)
*H01H 11/00* (2006.01)
(Continued)

(52) U.S. Cl.
CPC ..... *G01R 31/3275* (2013.01); *H01H 11/0062* (2013.01); *H01H 33/66* (2013.01);
(Continued)

(58) Field of Classification Search
None
See application file for complete search history.

(56) References Cited

U.S. PATENT DOCUMENTS 6,795,798 B2 9/2004 Eryurek et al.
7,170,418 B2 1/2007 Rose-Pehrsson et al.
(Continued)

FOREIGN PATENT DOCUMENTS

CN 1494670 A 5/2004
CN 101149420 A 3/2008
(Continued)

OTHER PUBLICATIONS

Payman Dehghanian; Circuit Breaker Operational Health Assessment via Condition Monitoring Data; 978-1-4799-5904-4/14/$31.00 © 2014 IEEE; Department of Electrical and Computer Engineering, Texas A&M University (Year: 2014).*
(Continued)

*Primary Examiner* — Nasima Monsur
(74) *Attorney, Agent, or Firm* — Sage Patent Group

(57) ABSTRACT

A method for monitoring a circuit breaker includes measuring at least two operating condition related parameters of the circuit breaker during operation of the circuit breaker; obtaining first data representing a vector having at least two components respectively representing the at least two measurements of the at least two parameters; judging location of the vector represented by the obtained data with respect to a vector space having an envelope separating healthy and unhealthy status of the circuit breaker, where the envelope has at least one portion of curvature; and generating a signal indicating the health status of the circuit breaker in consideration of the location of the vector if it is outside of the envelope.

14 Claims, 2 Drawing Sheets

(51) Int. Cl.
  *H01H 33/66* (2006.01)
  *H01H 33/666* (2006.01)
(52) U.S. Cl.
  CPC ............... *H01H 2033/6667* (2013.01); *H01H 2300/052* (2013.01)

(56) References Cited

U.S. PATENT DOCUMENTS

| | | | |
|---|---|---|---|
| 2002/0123864 | A1 | 9/2002 | Eryurek et al. |
| 2006/0006997 | A1 | 1/2006 | Rose-Pehrsson et al. |
| 2010/0088057 | A1* | 4/2010 | Kopaczewski ...... G01R 35/005 702/104 |
| 2015/0360578 | A1* | 12/2015 | Duan ..................... B60L 58/12 340/455 |
| 2016/0246185 | A1 | 8/2016 | Ypma et al. |
| 2016/0299192 | A1 | 10/2016 | Zhuang et al. |
| 2017/0047186 | A1 | 2/2017 | Chen et al. |
| 2017/0194113 | A1 | 7/2017 | Yang et al. |

FOREIGN PATENT DOCUMENTS

| | | |
|---|---|---|
| CN | 101702002 A | 5/2010 |
| CN | 101806861 A | 8/2010 |
| CN | 102269650 A | 12/2011 |
| CN | 102445640 A | 5/2012 |
| CN | 102509178 B | 6/2012 |
| CN | 102735999 B | 10/2012 |
| CN | 202650951 U | 1/2013 |
| CN | 103197001 A | 7/2013 |
| CN | 103267932 A | 8/2013 |
| CN | 103558529 A | 2/2014 |
| CN | 104765965 A | 7/2015 |
| CN | 105071541 A | 11/2015 |
| CN | 105093037 A | 11/2015 |
| CN | 105093038 A | 11/2015 |
| CN | 105093039 A | 11/2015 |
| CN | 105158608 A | 12/2015 |
| CN | 105242130 A | 1/2016 |
| CN | 105353301 A | 2/2016 |
| CN | 105628419 A | 6/2016 |
| CN | 105629100 A | 6/2016 |
| CN | 105973621 A | 9/2016 |
| CN | 105093040 A | 11/2018 |
| EP | 1022632 A1 | 7/2000 |
| EP | 2685575 A2 | 1/2014 |
| EP | 3293853 A1 | 3/2018 |
| GB | 2431726 A | 5/2007 |
| NL | 2013417 A | 4/2015 |
| WO | 2014053187 A1 | 4/2014 |
| WO | 2016176913 A1 | 11/2016 |
| WO | 2017060080 A1 | 4/2017 |

OTHER PUBLICATIONS

International Search Report and Written Opinion of the International Searching Authority for PCT/CN2017/106364, dated May 31, 2018, 10 pages.

Chinese Second Office Action dated Mar. 8, 2022 for Chinese Patent Application No. 201780095657.2, 3 pages (including English translation).

Extended European Search Report dated Apr. 7, 2021 for European Patent Application No. 17928956.6, 12 pages.

Chinese First Office Action dated Aug. 17, 2021 for Chinese Patent Application No. 201780095657.2, 12 pages (including English translation).

Feizifar, Behnam et al., "Condition Monitoring of Circuit Breakers: Current Status and Future Trends," 2017 IEEE International Conference on Environment and Electrical Engineering and 2017 IEEE Industrial and Commercial Power Systems Europe (EEEIC / I&CPS Europe), Jun. 6, 2017, 5 pages.

* cited by examiner

METHOD FOR MONITORING CIRCUIT BREAKER AND APPARATUS AND INTERNET OF THINGS USING THE SAME

CROSS REFERENCE TO RELATED APPLICATIONS

This application is a 35 U.S.C. § 371 national stage application of PCT International Application No. PCT/CN2017/106364 filed on Oct. 16, 2017, the disclosure and content of which is incorporated by reference herein in its entirety.

TECHNICAL FIELD

The invention relates to the field of circuit breaker, and more particularly to monitoring health condition of circuit breaker.

BACKGROUND ART

Circuit breaker is one of the most critical components of a Gas Insulation Switchgear (GIS) or a substation, whose safety and reliability are of high importance to the overall power grid. The market of smart circuit breaker is increasing rapidly these years, especially with the world's growing attention on digital products. Therefore, it's desired by the market a kind of smart circuit breaker being able to real-time monitor its defects and severity thereof before evolving to real failure, namely to monitor its health condition before real failure occurring. An example is disclosed in Patent CN 105628419 A. According the above referenced patent, the GIS mechanical defect diagnosis system has an acceleration sensor fixed in a detecting point position and the GIS shell surface position. A data processing device is connected with the acceleration sensor, a charge amplifier and a data acquisition unit. The data processing device receives a vibration signal according to independent component analysis process, and determine the GIS mechanical fault type solely in consideration of the received vibration signal if it is outside of a predetermined range.

However, the solution according to the prior art patent requires comparing the operating condition related parameter measurement (for example, the acceleration measurement) with thresholds defining a linear range. Where the health status of the circuit breaker were to be judged using various operating condition related parameters, for example opening/closing speed of a movable contact of the circuit breaker, travel of the movable contact, total travel of the movable contact, over travel of the movable contact, rebound of the movable contact, opening/closing time of the circuit breaker, and opening/closing peak coil electric current of the circuit breaker, most of the conventional solutions would have required individually comparing the measurement of the various types of operating condition related parameters of the circuit breaker and corresponding predetermined thresholds and judging health status of the circuit breaker upon a combination of the separate results of the comparisons if they respectively fall within the range between the corresponding thresholds. Because a correlation of the various operating condition related parameters is not considered to define their respective threshold range, missed fault and false alarm give major shortcomings in monitoring the health status of the circuit breaker. As a result, the prior art solutions are not often performed on a sufficiently accurate bases to detect the healthy or faulty condition.

BRIEF SUMMARY OF THE INVENTION

According to an aspect of present invention, it provides a method for monitoring a circuit breaker, including: measuring at least two operating condition related parameters of the circuit breaker during operation of the circuit breaker; obtaining first data representing a vector having at least two components respectively representing the at least two measurements of the at least two parameters; judging location of the vector represented by the obtained data with respect to a vector space having an envelope separating healthy and unhealthy status of the circuit breaker, where the envelope has at least one portion of curvature; and generating a signal indicating the health status of the circuit breaker in consideration of the location of the vector if it is outside of the envelope.

According to another aspect of present invention, it provides a system for monitoring a circuit breaker, including: at least one sensor, being configured to measure at least two operating condition related parameters of the circuit breaker during operation of the circuit breaker; and a controller, being configured to: obtain first data representing a vector having at least two components respectively representing the at least two measurements of the at least two parameters; judge location of the vector represented by the obtained data with respect to a vector space having an envelope separating healthy and unhealthy status of the circuit breaker, where the envelope has at least one portion of curvature; and generate a signal indicating the health status of the circuit breaker in consideration of the location of the vector if it is outside of the envelope.

According to another aspect of present invention, it provides an internet of things, including: the system for monitoring a circuit breaker, the circuit breaker, and a server, being configured to receive the signal indicating the health status of the circuit breaker.

By cutting off the vertices of the envelope conventionally in a linear shape and supplementing with each cut-off with a curvature, the newly adapted envelope takes the form of an ellipse having at least one portion of curvature. Therefore, both of the missed fault identification and the false alarm happened in the conventional solutions may be overcome.

Preferably, the controller may read the knowledge data base and past diagnosis results stored in the memory of the system, namely the history profile. From the history profile, second data are obtained representing the envelope of the vector space in consideration of a multiple of the vectors concerning the circuit breaker in healthy status according to a history profile when the circuit breaker operated normally; and the second data are stored; wherein: the envelope of the vector space is arranged to enclose the group of the multiple of vectors.

Preferably, the other portions of the envelope are shaped in curvature.

Preferably, in the vector space, the envelope is shaped to link the outmost vectors of the multiple of the vectors.

Preferably, the at least two operating condition related parameters of the circuit breaker concern with any at least two of: opening/closing speed of a movable contact of the circuit breaker, travel of the movable contact, total travel of the movable contact, over travel of the movable contact, rebound of the movable contact, opening/closing time of the circuit breaker, and opening/closing peak electric current of the circuit breaker.

BRIEF DESCRIPTION OF THE DRAWINGS

The subject matter of the invention will be explained in more detail in the following text with reference to preferred exemplary embodiments which are illustrated in the drawings, in which.

The reference symbols used in the drawings, and their meanings, are listed in summary form in the list of reference symbols. In principle, identical parts are provided with the same reference symbols in the figures.

PREFERRED EMBODIMENTS OF THE INVENTION

Figure 1:
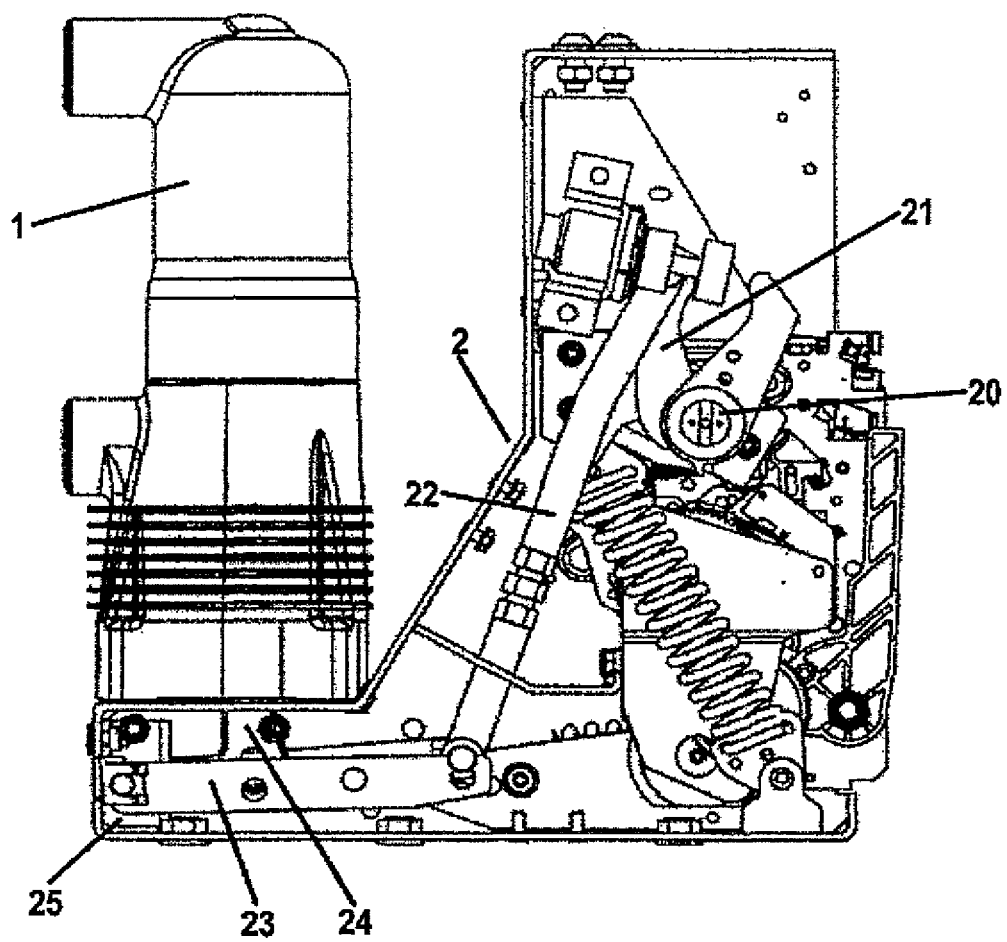
FIG. 1 illustrates an exemplary circuit breaker which can be on-line monitored by the method according to an embodiment of the present invention.

In the following description, for purposes of explanation and not limitation, specific details are set forth, such as particular circuits, circuit components, interfaces, techniques, etc. in order to provide a thorough understanding of the present invention. However, it will be apparent to one skilled in the art that the present invention may be practiced in other embodiments that depart from these specific details. In other instances, detailed descriptions of well-known methods and programming procedures, devices, and circuits are omitted so not to obscure the description of the present invention with unnecessary detail.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "connected" means "directly or indirectly connected", and the term "coupled" means "directly or indirectly connected".

FIG. 1 illustrates an exemplary circuit breaker which can be on-line monitored by the method according to an embodiment of the present invention. The circuit breaker as shown in FIG. 1 is a vacuum circuit breaker, comprising a stationary contact and a movable contact (not shown) enclosed in an insulation pole 1, and an actuating mechanism 2 for actuating the closing and opening action of the movable contact. The actuating mechanism 2 has a plurality of elements including a linkage mechanism and a spring. The linkage mechanism is for transmitting a driving force from an active element for example, a motor or the spring actuator, to the movable contact. As shown in FIG. 1, for example, the linkage mechanism may be a four-bar linage which comprises a first lever 21, a second level 22, a third lever 23 pivotally connected to each other in sequence. The first lever 21 is connected to a driving shaft 20 driven by an active element, and the third lever 23 is pivotally connected to a fixed point 25 on the base of the circuit breaker. For example, the fixed point 25 may be one of the fulcrums of the linkage mechanism. A push rod 24 on one end is pivotally connected to the movable contact at a distance from the pivot point between the third level 23 and the fixed point 25. The other end of the push rod 24 is connected to the movable contact in the insulation pole 1. By driving the driving shaft 20 rotating via the motor 26 or the spring, the movable contact can be moved up and down in a longitudinal direction in the pole 1 by the force transmission from the first lever 21, the second level 22, the third lever 23 and the push rod 24, so as to contact or be separated from the stationary contact and thus close or open the circuit. The circuit breaker as shown in FIG. 1 may include a magnetic actuator arrangement (not shown in FIG. 1), comprising electromagnetic coil, electrical supply means for supplying the coil electric current to the coil, a latch for securing the circuit breaker's door closed capable of moving between first and second extreme positions within the magnetic actuator under influence of the coil, and electronic switch means for energising and de-energising the coil.

Figure 2:
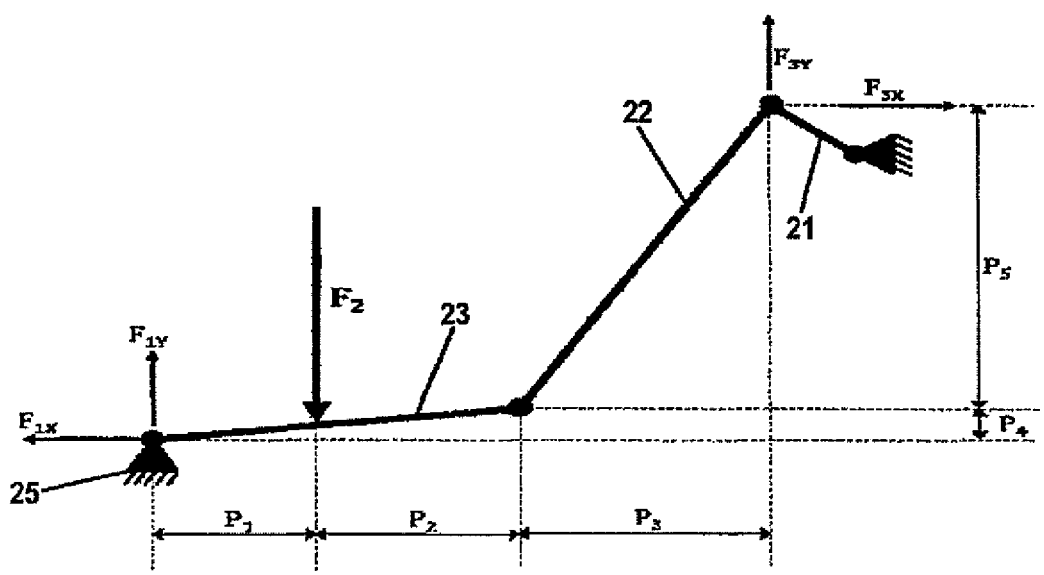
FIG. 2 illustrates the force applied on the linkage mechanism of the circuit breaker as shown in FIG. 1.

FIG. 2 illustrates the force applied on the linkage mechanism of the circuit breaker as shown in FIG. 1. In a balanced closed state of the circuit breaker, the movable contact abuts against the stationary contact under a force from the linkage mechanism. In this case, the stationary contact would apply a counter force F2 (also referred to as contact force) on the movable contact which is in turn conducted to the third lever 23 through the push rod 24. Once the movable contact is separated from the stationary contact in the opening period, the counter force F2 on the movable contact, the push rod 24 and the third lever 23 would decrease dramatically and even become zero. Likewise, during the closing period of the circuit breaker, the counter force F2 applied on the movable contact by the stationary contact would dramatically from zero to a relative high value.

The operating condition of the circuit breaker includes at least one of:

a. opening/closing speed of a movable contact of the circuit breaker, b. travel of the movable contact, c. total travel of the movable contact, d. over travel of the movable contact, e. rebound of the movable contact, f. opening/closing time of the circuit breaker, and g. opening/closing peak coil electric current of the circuit breaker.

The opening/closing speed of a movable contact of the circuit breaker is calculated between two points on the travel curve as defined by the speed calculation zone. The speed calculation zone is part of the circuit breaker type specific default settings and matches the points used for off-line timing.

The travel of the movable contact refers to the distance from where the movable starts to move until it reaches a position where the arcing contacts meet per design. This position is referred to as the "travel" and is measured from the fully closed position.

The total travel of the movable contact refers to the distance traveled from minimum to maximum position, so it includes over travel of the movable contact.

Rebound of the movable contact refers to a series of rebounds happening during the period from the first contact between movable contact and stationary contact to the eventual reliable contact established.

The timing of the opening/closing refers to the time calculated between the two points on the travel curve as defined by the speed calculation zone. The operation cycle covers a period when the circuit breaker starts from closing to opening or vice versa.

Opening/closing peak coil electric current of the circuit breaker. The circuit breaker as shown in FIG. 1 may include a magnetic actuator arrangement, comprising electromagnetic coil, electrical supply means for supplying the coil electric current to the coil, a latch for securing the circuit breaker's door closed capable of moving between first and second extreme positions within the magnetic actuator under influence of the coil, and electronic switch means for energising and de-energising the coil. A circuit breaker having the defect can still operate but will eventually develop into a failure. A defect stage occurs between normal stage and failure stage. A defect of circuit breaker results in an abnormity of those operating conditions of the circuit breaker. Accordingly, in order to improve reliability and accuracy of diagnosis of the health status of the circuit breaker, at least two of the operating conditions may be monitored. The present invention provides a highly sensitivity and highly accurate abnormality diagnosing solution using those operating condition related parameters of the circuit breaker during operation of the circuit breaker. For example, an embodiment using two of the operating condition related parameters, namely the opening/closing peak coil electric current of the circuit breaker and the opening/closing speed of a movable contact of the circuit breaker, is described thereafter for explaining the present invention. The skilled person should understand that any two or more of the operating condition related parameters may be used for diagnosis of the health condition of the circuit breaker.

Figure 3:
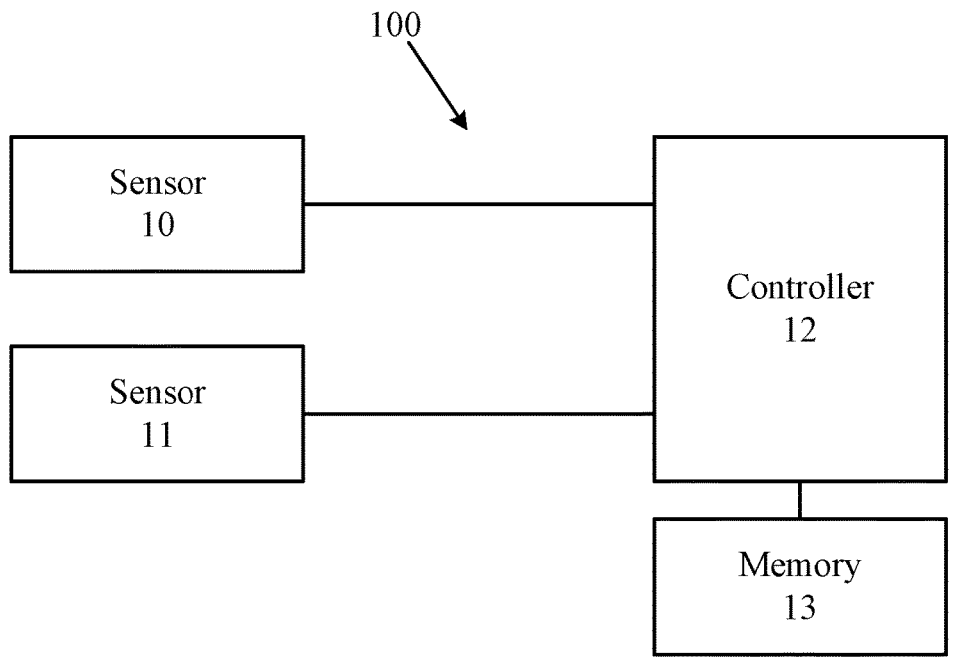
FIG. 3 shows a system for monitoring a circuit according to an embodiment of present invention.

FIG. 3 shows a system for monitoring a circuit according to an embodiment of present invention. Two of the operating condition related parameters, namely the opening/closing peak coil electric current of the circuit breaker and the opening/closing speed of a movable contact of the circuit breaker, are described thereafter for explaining the present invention. As shown in FIG. 3, the system 100 includes at least one sensor, for example a first sensor 10 and a second sensor 11 being configured to respectively measure a first operating condition related parameter and a second operating condition related parameter of the circuit breaker during operation of the circuit breaker. The skilled person should understand that two or more than two of the operating condition related parameters can be measured by one sensor. For example, those related to the movement of movable contact of the circuit breaker may be measured by the same encoder, including but not limited to the opening/closing speed of a movable contact of the circuit breaker, the travel of the movable contact, the total travel of the movable contact, the over travel of the movable contact, and rebound of the movable contact.

In this embodiment, the first operating condition related parameter may be of the coil electric current of the circuit breaker; the first sensor 10 may use a hall sensor to measure AC current, producing an alternating current (AC) in its secondary which is proportional to the coil electric current of the circuit breaker in its primary, of which corresponding to the instance of circuit breaker opening/closing may be processed into the opening/closing peak coil electric current of the circuit breaker by the controller 12 of the system 100. The current transformer scales the large value of the coil electric current to small, standardized values that are easy to handle for the controller 12 of the system 100. It isolates measurement from the high voltage of the circuit breaker and presents a negligible load to the circuit breaker. Besides, the second operating condition related parameter may be of speed of the movable contact of the circuit breaker; the second sensor 11 may use a rotary encoder to provide information about the motion of the driving shaft 20, of which corresponding to the instance of circuit breaker opening/closing may be processed into information as speed by a controller 12 of the system 100. The input of the rotary encoder is mechanically coupled to the driving shaft 20, which converts the angular position or motion of the shaft to an analog or digital signal.

The skilled person should understand that the other operating condition related parameters, like the travel of the movable contact, the total travel of the movable contact, the over travel of the movable contact, the rebound of the movable contact, and the opening/closing time of the circuit breaker may be obtained through force sensor, hall sensor, and/or vibration sensor. The first sensor 10 and the second sensor 11 may send data concerning the first operating condition related parameter and the second operating condition related parameter to the controller 12, thus from a state space point of view, the controller 12 may obtain a first data representing a vector having two components respectively representing the first operating condition related parameter and the second operating condition related parameter.

The controller 12 of the system 100 mainly provides for comparison processing of the first operating condition related parameter and the second operating condition related parameter of the circuit breaker detected by the first sensor 10 and the second sensor 11 with a healthy pattern. In addition, the data from the first sensor 10 and the second sensor 11 are considered so that the factors of circuit breaker's healthy status can be made by the final prognosis. The prognosis judgment is made based upon a knowledge data base and past diagnosis results stored in a memory 13 of the system 100.

Figure 4:
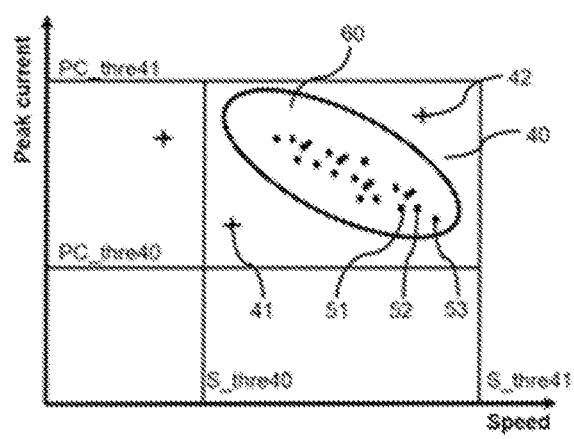
FIG. 4 and FIG. 5 respectively show healthy vector space linearly defined by two threshold ranges concerning two types of operating condition related parameters.
Figure 5:
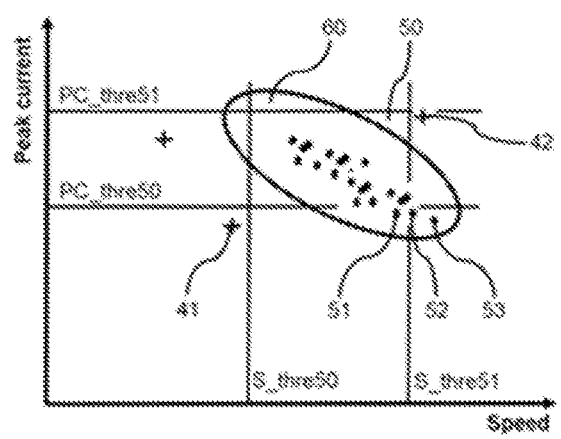

FIG. 4 and FIG. 5 respectively show healthy vector space linearly defined by two threshold ranges concerning two types of operating condition related parameters. The graphs of FIG. 4 and FIG. 5 include an x-axis indicative of one of the components of the vector, namely the first operating condition related parameter, which, in this embodiment, corresponds to the opening/closing peak coil electric current of the circuit breaker; and an y-axis indicative of the other of the components of the vector, namely the second operating condition related parameter, which, in this embodiment, corresponds to the speed of the movable contact of the circuit breaker. Conventionally, by using linear analysis of the vectors from past diagnosis results, the vector spaces of the envelopes 40, 50 separating healthy and unhealthy status of the circuit breaker are shaped in rectangle. In particular considering FIG. 4, such area is bounded by x=S_thre40, x=S_thre41, y=PC_thre40, y=PC_thrd41, and for FIG. 5, such area is bounded by x=S_thre50, x=S_thre51, y=PC_thre50, y=PC_thrd51. The dots (vectors) presented in FIG. 4 and FIG. 5 illustrate the healthy pattern, where the circuit breaker operating with the first operating condition related parameter and the second operating condition related parameter as indicted by each of the dots is observed to be in healthy status extracted from a history profile. While according to the history profile, the crosses (vectors) presented in FIG. 4 and FIG. 5 give the unhealthy pattern, where the circuit breaker operating with the first operating condition related parameter and the second operating condition related parameter as indicted by each of the crosses is observed to be in unhealthy status.

As shown in FIG. 4, by applying the vector space defined by the envelope 40 for judging the healthy status of the circuit breaker, the crosses 41, 42 are located therein. Therefore, a circuit breaker in fact operates in an unhealthy status would be misjudged as healthy, causing a missed fault identification.

In order to overcome the defect of missed fault identification, the envelope 40 is shrinks horizontally and vertically, transforming into the envelope 50 as shown in FIG. 5. By applying the vector space defined by the envelope 50, the crosses 41, 42 would be excluded therefrom, however the dots 51, 52, 53 would stay outside of the envelope 50. Therefore, a circuit breaker in fact operates in a healthy status would be misjudged as unhealthy, causing a false alarm.

By analysis of the envelopes 40, 50 and the healthy pattern statistically, it can be observed that a healthy status of the circuit breaker hardly occurs in an area close to each of the four vertices. Thus, by cutting off the vertices of the envelope 40, 50 and supplementing with each cut-off with a curvature, both of the missed fault identification and the false alarm may be overcome. As shown in FIG. 4 and FIG. 5, in this embodiment, the newly adapted envelope 60 takes the form of an ellipse having at least one portion of curvature.

Preferably, the controller 12 may read the knowledge data base and past diagnosis results stored in the memory 13 of the system 100, namely the history profile. From the history profile, the controller 12 may obtain a second data representing the envelope 60 of the vector space in consideration of a multiple of the vectors of the dots concerning the circuit breaker in healthy status when the circuit breaker operated normally. The envelope 60 of the vector space is arranged to enclose the group of the multiple of vectors (dots), which shall follow the healthy pattern with at least one portion of curvature. Then, the controller 12 may record the second data representing the vector space defined by the envelope 60 in the memory 13. In the vector space defined by the envelope 60, the envelope is shaped to link the outmost vectors of the multiple of the vectors.

By applying the envelope 60 separating healthy and unhealthy status of the circuit breaker, the controller 12 may give the judgement that the crosses 41, 42 are located outside of the vector space defined by the envelope 60, while the dots 51, 52, 53 are located inside thereof. Based on the judgement, the controller 12 may generate a signal indicating the health status of the circuit breaker in consideration of the location of the vector if it is outside of the envelope 60. In this embodiment for example, the controller 12 will give signal indicating a healthy status of the circuit in consideration of the situation where the dots are inside of the envelope 60, or a signal indicating an unhealthy status in consideration of the situation where the crosses are outside of the envelope 60. The present invention provides a highly sensitivity and highly accurate health prognosis system using a multiple of operating condition related parameter.

The above embodiment is exemplified with the vector space of two dimensions. The skilled person should understand that the vector space may be extended to more than two dimensions when considering the vector having more than two components. For example, the vector may include components involving any two or more of the operating condition of the circuit breaker:

a. opening/closing speed of a movable contact of the circuit breaker,
b. travel of the movable contact,
c. total travel of the movable contact,
d. over travel of the movable contact,
e. rebound of the movable contact,
f. opening/closing time of the circuit breaker, and
g. opening/closing peak coil electric current of the circuit breaker.

According to an embodiment of present invention, an internet of things includes the system for monitoring the circuit according to an embodiment of present invention, the circuit breaker, and a server being configured to receive the signal indicating the health status of the circuit breaker.

Though the present invention has been described on the basis of some preferred embodiments, those skilled in the art should appreciate that those embodiments should by no way limit the scope of the present invention. Without departing from the spirit and concept of the present invention, any variations and modifications to the embodiments should be within the apprehension of those with ordinary knowledge and skills in the art, and therefore fall in the scope of the present invention which is defined by the accompanied claims.

The invention claimed is:

1. A method for monitoring a circuit breaker, comprising:
measuring at least two types of operating condition related parameters of the circuit breaker during operation of the circuit breaker by at least one sensor;
obtaining first data representing a vector having at least two components respectively representing at least two measurements of the at least two operating condition related parameters;
generating a rectangle envelope on a cartesian plane, the envelope bounded by two threshold ranges concerning the at least two operating condition related parameters, wherein an x-axis of the cartesian plane indicates one of the at least two types of operating condition parameters and a y-axis on the cartesian plane indicates another of the at least two types of operating condition parameters;
generating an elliptical envelope by cutting off vertices of the rectangle envelope and supplementing with each cut-off with a curvature to eliminate missed fault identification and false alarm associated with the rectangle envelope;
judging location of the vector represented by the obtained first data with respect to a vector space defined by the elliptical envelope separating healthy and unhealthy status of the circuit breaker to determine a health status of the circuit breaker; and
generating a signal indicating the health status of the circuit breaker in consideration of the location of the vector if it is outside of the elliptical envelope;
wherein the at least two types of operating condition related parameters of the circuit breaker comprise at least two of: opening/closing speed of a movable contact of the circuit breaker, travel of the movable contact, total travel of the movable contact, over travel of the movable contact, rebound of the movable contact, opening/closing time of the circuit breaker, and opening/closing peak coil electric current of the circuit breaker.

2. The method according to claim 1, further comprising:
obtaining second data representing the elliptical envelope in consideration of a multiple of vectors concerning the circuit breaker in healthy status according to a history profile when the circuit breaker operated normally; and
recording the second data;

wherein:
the elliptical envelope is arranged to enclose the multiple of vectors.

3. The method according to claim 2, wherein:
the elliptical envelope is shaped to link outmost vectors of the multiple of vectors.

4. A system for monitoring a circuit breaker, comprising:
at least one sensor, being configured to measure at least two types of operating condition related parameters of the circuit breaker during operation of the circuit breaker by at least one sensor; and
a controller, being configured to:
obtain first data representing a vector having at least two components respectively representing at least two measurements of the at least two operating condition related parameters;
generate a rectangle envelope on a cartesian plane, the envelope bounded by two threshold ranges concerning the at least two operating condition related parameters, wherein an x-axis of the cartesian plane indicates one of the at least two types of operating condition parameters and a y-axis on the cartesian plane indicates another of the at least two types of operating condition parameters;
generate an elliptical envelope by cutting off vertices of the rectangle envelope and supplement with each cut-off with a curvature to eliminate missed fault identification and false alarm associated with the rectangle envelope;
judge location of the vector represented by the obtained first data with respect to a vector space defined by the elliptical envelope separating healthy and unhealthy status of the circuit breaker to determine a health status of the circuit breaker; and
generate a signal indicating the health status of the circuit breaker in consideration of the location of the vector if it is outside of the elliptical envelope;
wherein the at least two types of operating condition related parameters of the circuit breaker comprise at least two of: opening/closing speed of a movable contact of the circuit breaker, travel of the movable contact, total travel of the movable contact, over travel of the movable contact, rebound of the movable contact, opening/closing time of the circuit breaker, and opening/closing peak coil electric current of the circuit breaker.

5. The system according to claim 4, further comprising:
a memory;
wherein:
the controller is further configured to:
obtain second data representing the elliptical envelope in consideration of a multiple of vectors concerning the circuit breaker in healthy status according to a history profile when the circuit breaker operated normally; and
record the second data in the memory;
wherein:
the elliptical envelope is arranged to enclose the multiple of vectors.

6. The system according to claim 5, wherein:
the elliptical envelope is shaped to link the outmost vectors of the multiple of vectors.

7. An internet of things, comprising:
the system according to claim 4;
the circuit breaker; and
a server, being configured to receive the signal indicating the health status of the circuit breaker.

8. A method for monitoring a circuit breaker, comprising:
measuring first and second types of operating condition related parameters of the circuit breaker during operation of the circuit breaker using at least one sensor;
obtaining first data representing a vector having a first component representing a measurement of the first type of operating condition parameter and a second component representing a measurement of the second type of operating condition parameter;
generating a rectangle envelope on a cartesian plane, the envelope bounded by two threshold ranges concerning the first and second operating condition related parameters, wherein an x-axis of the cartesian plane indicates one of the first and second types of operating condition parameters and a y-axis on the cartesian plane indicates another of the first and second types of operating condition parameters;
generating an elliptical envelope by cutting off vertices of the rectangle envelope and supplementing with each cut-off with a curvature to eliminate missed fault identification and false alarm associated with the rectangle envelope;
judging location of the vector represented by the obtained first data with respect to a vector space defined by the elliptical envelope separating healthy and unhealthy status of the circuit breaker to determine a health status of the circuit breaker; and
generating a signal indicating the health status of the circuit breaker in consideration of the location of the vector;
wherein the first and second types of operating condition related parameters of the circuit breaker comprise at least two of: opening/closing speed of a movable contact of the circuit breaker, travel of the movable contact, total travel of the movable contact, over travel of the movable contact, rebound of the movable contact, opening/closing time of the circuit breaker, and opening/closing peak coil electric current of the circuit breaker.

9. The method according to claim 8, further comprising:
generating a plurality of measurements of the first and second operating condition related parameters during operation of the circuit breaker while the circuit breaker is operating in a healthy operating condition;
obtaining second data representing a plurality of vectors having a plurality of components respectively representing the plurality of measurements of the first and second operating condition related parameters;
enclosing the plurality of vectors concerning the circuit breaker in healthy status by the elliptical envelope; and
storing the elliptical envelope in a memory of a circuit breaker monitoring system.

10. The method according to claim 9, wherein a shape of the elliptical envelope is defined by outmost ones of the plurality of vectors.

11. The method according to claim 9, wherein the elliptical envelope is shaped to link outmost ones of the plurality of vectors.

12. The method according to claim 8, wherein the first operating condition comprises a coil electric current of the circuit breaker and the method further comprises measuring the coil electric current of the circuit breaker with a Hall effect switch.

13. The method according to claim 8, wherein the second operating condition comprises a speed of a movable contact of the circuit breaker and the method further comprises measuring the speed of the movable contact of the circuit breaker with an encoder.

14. A system for monitoring a circuit breaker, comprising:
- at least one sensor, wherein the at least one sensor is configured to measure first and second operating condition related parameters of the circuit breaker during operation of the circuit breaker; and
- a controller configured to perform operations according to claim 8.

* * * * *